(12) United States Patent
Jung et al.

(10) Patent No.: US 8,994,266 B2
(45) Date of Patent: Mar. 31, 2015

(54) DISPLAY DEVICE

(71) Applicant: Samsung Display Co., Ltd., Yongin-si, Gyeonggi-do (KR)

(72) Inventors: Hae-Goo Jung, Yongin-si (KR); Do-Hyung Ryu, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 262 days.

(21) Appl. No.: 13/736,761

(22) Filed: Jan. 8, 2013

(65) Prior Publication Data

US 2014/0054557 A1 Feb. 27, 2014

(30) Foreign Application Priority Data

Aug. 21, 2012 (KR) .................. 10-2012-0091473

(51) Int. Cl.
*H05K 7/06* (2006.01)
*H01L 51/52* (2006.01)
*G02F 1/00* (2006.01)

(52) U.S. Cl.
CPC .............. *H05K 7/06* (2013.01); *H01L 51/5296* (2013.01); *G02F 1/00* (2013.01)
USPC .......................................... 313/512; 361/767

(58) Field of Classification Search
None
See application file for complete search history.

(56) References Cited

U.S. PATENT DOCUMENTS

| | | | | |
|---|---|---|---|---|
| 8,258,523 | B2 * | 9/2012 | Lee et al. | 257/91 |
| 8,421,353 | B2 * | 4/2013 | Ra et al. | 313/512 |
| 8,497,627 | B2 * | 7/2013 | Lee et al. | 313/504 |
| 8,643,002 | B2 * | 2/2014 | Ryu et al. | 257/40 |
| 2005/0156509 | A1 * | 7/2005 | Yamazaki et al. | 313/498 |
| 2012/0025700 | A1 * | 2/2012 | Ryu et al. | 313/512 |
| 2012/0026074 | A1 * | 2/2012 | Lee et al. | 345/76 |
| 2012/0075261 | A1 * | 3/2012 | Ryu et al. | 345/204 |
| 2012/0097987 | A1 * | 4/2012 | Ryu et al. | 257/88 |
| 2012/0104420 | A1 * | 5/2012 | Lee et al. | 257/88 |
| 2012/0133278 | A1 * | 5/2012 | Ryu | 313/512 |
| 2013/0020967 | A1 * | 1/2013 | Jung et al. | 315/312 |

FOREIGN PATENT DOCUMENTS

| | | |
|---|---|---|
| JP | 2007-5223 | 1/2007 |
| KR | 10-2010-0035887 | 4/2010 |
| KR | 10-2011-0015820 | 2/2011 |
| KR | 10-1180019 | 9/2012 |

* cited by examiner

*Primary Examiner* — Britt D Hanley
(74) *Attorney, Agent, or Firm* — Christie, Parker & Hale, LLP

(57) ABSTRACT

A display device including a substrate, a display unit on the substrate, a sealing substrate coupled to the display unit, a plurality of power pads on the sealing substrate and electrically coupled to the display unit, and a connector including a housing unit, a power connection unit electrically coupled to the plurality of power pads, and a power contact unit for maintaining contact between the plurality of power pads and the power connection unit.

22 Claims, 6 Drawing Sheets

DISPLAY DEVICE

CROSS-REFERENCE TO RELATED PATENT APPLICATION

This application claims priority to and the benefit of Korean Patent Application No. 10-2012-0091473, filed on Aug. 21, 2012, in the Korean Intellectual Property Office, the disclosure of which is incorporated herein in its entirety by reference.

BACKGROUND

1. Field

Embodiments of the present invention relate to a display device that may be coupled to a power pad.

2. Description of the Related Art

Organic light-emitting display devices are self-emissive display devices that have the advantages of a wide viewing angle, a great contrast ratio, and a fast response time. Accordingly, organic light-emitting display devices may be used in portable devices such as, for example, a digital camera, a video camera, a camcorder, a mobile information terminal, a smartphone, an ultrathin notebook, and a tablet personal computer, and may be used in electronic devices such as, for example, an ultrathin television.

Flexible display devices, which are easy to carry and may be applicable to devices having various shapes, have recently been studied as next-generation display devices. From among them, flexible display devices based on organic light-emitting display appear to be the most promising.

To drive a display device such as an organic light-emitting display device, a power connection unit such as, for example, a flexible printed cable (FPC) electrically coupled to a power pad may be used. To couple the FPC to the power pad, heat has to be applied through welding or soldering. However, since the display device is formed of a thin film material, thermal deformation may occur.

SUMMARY

Embodiments of the present invention provide a display device having a connector structure that may be coupled to a power pad.

According to an aspect of embodiments of the present invention, there is provided a display device including a substrate, a display unit on the substrate, a sealing substrate coupled to the display unit, a plurality of power pads on the sealing substrate and electrically coupled to the display unit, and a connector including a housing unit, a power connection unit electrically coupled to the plurality of power pads, and a power contact unit for maintaining contact between the plurality of power pads and the power connection unit.

The power connection unit may include a circuit board for applying an electrical signal to the plurality of power pads, and a conductive gasket including a first side electrically coupled to the circuit board, and a second side electrically coupled to the plurality of power pads.

A plurality of wires of an external power supply unit for supplying external power may be coupled to the circuit board.

The conductive gasket may include an elastic portion, and a conductive portion coupled to the elastic portion, and coupled to the circuit board and the plurality of power pads.

The conductive portion may surround the elastic portion with an adhesive therebetween.

An outer surface of the conductive gasket may be curved to enable substantially uniform area contact with the plurality of power pads.

The elastic portion may include at least one of polyurethane, rubber, or siliconee.

The conductive portion may include a metal foil.

The power contact unit may include a magnetic material for attracting the sealing substrate to the connector using magnetic force.

The magnetic material may include a neodymium magnet.

The power contact unit may include a first surface attached to an outer surface of the sealing substrate, and a second surface opposite to the first surface and located in the housing unit.

The display device may further include a conductive plate between the sealing substrate and the connector.

The power contact unit may include a first surface attached to a mount surface of the conductive plate, and a second surface opposite to the first surface and located in the housing unit, and the conductive plate may be attached to an outer surface of the sealing substrate by an adhesive.

The plurality of power pads may include a first power pad, and a second power pad, and the connector may include at least one power contact unit, and first and second power connection units in the housing unit and electrically coupled to the first power pad and the second power pad, respectively.

The plurality of power pads may include a first power pad and a second power pad that each contact a conductive gasket, and the sealing substrate may include an insulating film include a first surface facing away from the display unit, and a second surface facing the display unit, a first conductive film on the first surface, and a second conductive film on the second surface, and the first power pad may be for supplying first power and may be located on a surface of the first conductive film, and the second power pad may be for supplying second power and may be located on a surface of the second conductive film.

The display unit may include a first electrode having a positive polarity and a second electrode having a negative polarity, a first connecting unit for applying an electrical signal may be between the first electrode and the first conductive film to form a first power path, and a second connecting unit for applying an electrical signal may be between the second electrode and the second conductive film to form a second power path.

The first connecting unit may include a first connection unit on a wiring line coupled to the first electrode, a contact unit electrically coupled to the first connection unit and corresponding to a gap in the second conductive film, and a second connection unit at an edge of the insulating film and electrically coupled to the contact unit and the first conductive film.

Each of the first connection unit and the second connection unit may include a conductive tape or a conductive ball.

The second pad may be located on an outer surface of the second conductive film that is exposed to the outside through a first hole in the first conductive film and a second hole in the insulating film.

The second connecting unit may be located on a wiring line coupled to the second electrode, and may be electrically coupled to the second conductive film.

The second connecting unit may include a conductive tape or a conductive ball.

The display unit may include a thin film transistor (TFT) on the substrate, an insulating layer for insulating an element of the TFT, and an organic light-emitting element electrically coupled to the TFT, and including a first electrode, an organic layer on the first electrode, and a second electrode on the organic layer.

BRIEF DESCRIPTION OF THE DRAWINGS

The above and other aspects of embodiments of the present invention will become more apparent by describing in detail exemplary embodiments thereof with reference to the attached drawings in which.

DETAILED DESCRIPTION

Figure 1:
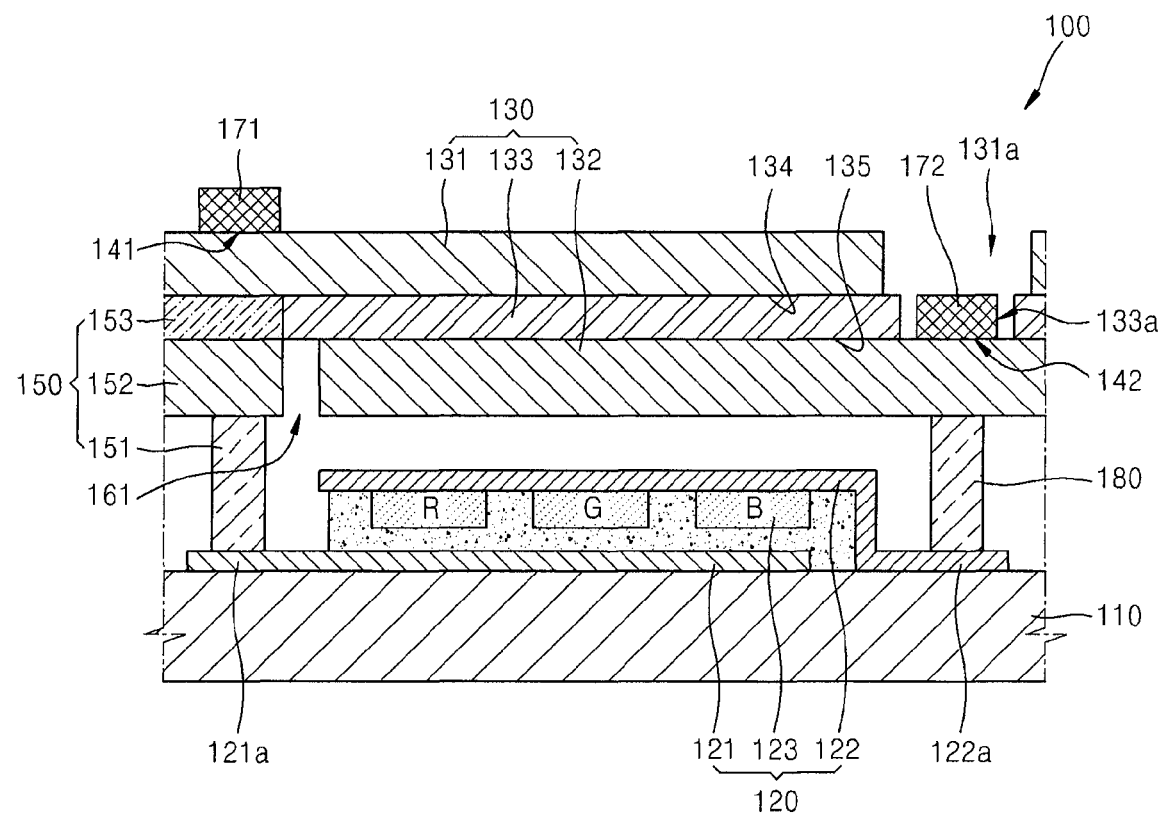
FIG. 1 is a cross-sectional view illustrating a display device according to an embodiment of the present invention.

As used herein, the term "and/or" includes any and all combinations of one or more of the associated listed items. Expressions such as "at least one of," when preceding a list of elements, modify the entire list of elements and do not modify the individual elements of the list.

While exemplary embodiments of the invention are susceptible to various modifications and alternative forms, specific embodiments thereof are shown by way of examples in the drawings, and will be described in detail herein. It should be understood, however, that there is no intent to limit exemplary embodiments of the invention to the particular forms disclosed, but conversely, exemplary embodiments of the invention are to cover all modifications, equivalents, and alternatives falling within the spirit and scope of the invention. In the following description, a detailed description of known functions and configurations incorporated herein will be omitted when it may make the subject matter of the present invention unclear.

It will be understood that, although the terms first, second, etc. may be used herein to describe various elements, these elements should not be limited by these terms, which are used to distinguish one element from another.

The terminology used herein is for the purpose of describing particular embodiments, and is not intended to be limiting of exemplary embodiments of the invention. As used herein, the singular forms "a", "an" and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Embodiments of the present invention will now be described more fully with reference to the accompanying drawings, in which exemplary embodiments of the invention are shown. In the drawings, the same elements are denoted by the same reference numerals, and a repeated detailed explanation thereof will not be given.

FIG. 1 is a cross-sectional view illustrating a display device 100 according to an embodiment of the present invention.

Although the display device 100 is an organic light-emitting display device in FIG. 1, the present embodiment is not limited thereto, and the display device 100 may be a liquid crystal display device, a field emission display device, a plasma display device, an electroluminescent display device, or an electrophoretic display device.

Referring to FIG. 1, the display device 100 includes a substrate 110 on which at least one thin film transistor (TFT) is formed. The substrate 110 may be an insulating substrate formed of glass or plastic.

An organic light-emitting element 120, such as an organic light-emitting diode (OLED), is formed on the substrate 110. The organic light-emitting element 120 includes a first electrode 121, a second electrode 122, and an organic layer 123 therebetween.

A sealing substrate 130 for sealing a space over the substrate 110 is provided above the organic light-emitting element 120.

The sealing substrate 130 includes a first conductive film 131, a second conductive film 132, and an insulating film 133 therebetween.

The first conductive film 131 is stacked on a first surface 134 of the insulating film 133 that faces away from the organic light-emitting element 120. The second conductive film 132 contacts a second surface 135 of the insulating film 133 that faces the organic light-emitting element 120.

A first power pad 141 for supplying first power ELVDD is formed on the first conductive film 131, and a second power pad 142 for supplying second power ELVSS is formed on the second conductive film 132.

The first power pad 141 is electrically coupled to the first electrode 121 having a positive (+) polarity. A first connecting unit 150 for applying an electrical signal is formed between the first power pad 141 and the first electrode 121.

The first connecting unit 150 includes a first connection unit 151, a contact unit 152, and a second connection unit 153.

The first connection unit 151 has a pillar shape formed on a wiring line 121a that is electrically coupled to the first electrode 121. The first connection unit 151 may be, but is not limited to, any metal member having high conductivity such as a conductive tape or a conductive ball.

The contact unit 152 is formed on the same level as the second conductive film 132. The contact unit 152 may be formed by using the second conductive film 132. That is, when the second conductive film 132 is blanked by using a metal press, a space (e.g., gap) 161 may be formed by removing a portion of the second conductive film 132, and the contact unit 152 may be formed to be insulated from the second conductive film 132 with the space 161 therebetween. The contact unit 152 corresponds to a portion of the second conductive film 132 that is independently formed with the space 161 therebetween. The contact unit 152 is electrically coupled to the first connection unit 151.

Alternatively, a conductive layer electrically coupled to the first connection unit 151 may be formed around an edge of the second conductive film 132 with an interval therebetween.

Also, an insulating material for improving insulation properties may be applied between the second conductive film 132 and the contact unit 152.

The second connection unit 153 is formed on the same level as the insulating film 133, and is formed at an edge of the insulating film 133. The second connection unit 153 may be, but is not limited to, a conductive member such as a conductive tape or a conductive ball. One side of the second connection unit 153 is electrically coupled to the contact unit 152, and the other side of the second connection unit 153 is electrically coupled to the first conductive film 131.

A first connector 171 for enabling the supply of the first power ELVDD from the outside is coupled to the first power pad 141 on an outer surface of the first conductive film 131.

As such, a first power path is formed when the wiring line 121a electrically coupled to the first electrode 121, the first connection unit 151, the contact unit 152, the second connection unit 153, and the first conductive film 131 are electrically coupled to one another, and the first power ELVDD may be supplied when the first connector 171 including a conductive gasket which will be explained below is attached to the first power pad 141.

The second power pad 142 is electrically coupled to the second electrode 122 having a negative (−) polarity, and is formed at an outer surface of the second conductive film 132 that is exposed when holes 131a and 133a are respectively formed in the first conductive film 131 and the insulating film 133.

That is, the first hole 131a is formed in the first conductive film 131 (in a thickness direction of the first conductive film 131). The second hole 133a is formed in the insulating film 133 (in a thickness direction of the second insulating film 133). The second hole 133a communicates with the first hole 131a.

A portion of the outer surface of the second conductive film 132 is exposed to the outside through the first hole 131a and the second hole 133a, which communicates with the first hole 131a. The second power pad 142 is formed at the exposed portion of the outer surface of the second conductive film 132.

A second connecting unit 180 is formed for applying an electrical signal between the second power pad 142 and the second electrode 122. The second connecting unit 180 has a pillar shape formed on a wiring line 122a electrically coupled to the second electrode 122, and is electrically coupled to a bottom surface of the second conductive film 132. The second connecting unit 180 can be, but is not limited to, a metal member having high conductivity, such as a conductive tape or a conductive ball. Alternatively, without the second connecting unit 180, the second conductive film 132 may be directly coupled to the second electrode 122.

A second connector 172 for supplying the second power ELVSS from the outside is coupled to the second power pad 142 formed at the exposed portion of the outer surface of the second conductive film 132. In the present embodiment, an insulating film for insulation between the second connector 172 and the first conductive film 131, which have different polarities, may also be formed on an inner wall of the first conductive film 131 in which the first hole 131a is formed.

As such, a second power path is formed when the wiring line 122a, which is electrically coupled to the second electrode 122, the second connecting unit 180, and the second conductive film 132 are electrically coupled to one another, and the second power ELVSS may be supplied when the second connector 172 including a conductive gasket, which will be explained below, is attached to the second power pad 142.

In the display device 100 constructed as described above, since the first hole 131a and the second hole 133a are respectively formed in the first conductive film 131 and the insulating film 133 by using punching, power may be supplied by respectively coupling the first connector 171 and the second connector 172 to the first power pad 141 and the second power pad 142.

Areas to be punched may vary according to where power is to be supplied, or according to a structure of a module. The first power ELVDD and the second power ELVSS may be supplied through a power path formed by folding a portion of the sealing substrate 130 to electrically couple ends of the portion, instead of punching.

Figure 2:
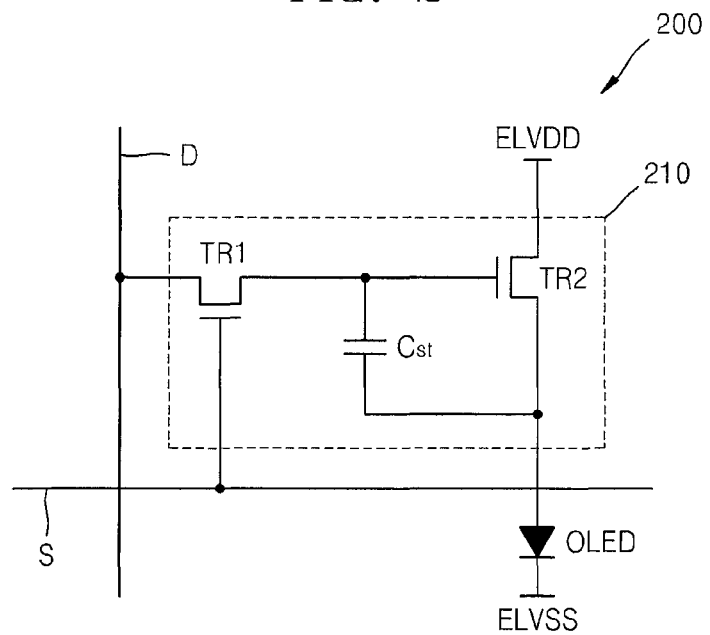
FIG. 2 is a circuit diagram illustrating a sub-pixel of the display device of the embodiment shown in FIG. 1, according to an embodiment of the present invention.

FIG. 2 is a circuit diagram illustrating a sub-pixel 200 of the display device of FIG. 1, according to an embodiment of the present invention.

Referring to FIG. 2, the sub-pixel 200 includes an organic light-emitting element such as an OLED, and a pixel circuit 210 that is coupled to a data line D and to a scan line S, and that controls the organic light-emitting element OLED.

In FIG. 1, an anode of the organic light-emitting element, for example, the first electrode 121, is coupled to the pixel circuit 210, and a cathode of the organic light-emitting element, for example, the second electrode 122, is electrically coupled to a power supply source that supplies second power ELVSS.

The organic light-emitting element OLED constructed as described above generates light (e.g., light having a predetermined brightness) to correspond to current supplied from the pixel circuit 210.

The pixel circuit 210 controls the amount of current supplied to the organic light-emitting element OLED corresponding to a data signal applied to the data line D when a scan signal is applied to the scan line S. To this end, the pixel circuit 210 includes a first TFT TR1 coupled to the data line D and the scan line S, a second TFT TR2 coupled to the first TFT TR1 and a power supply source that supplies first power ELVDD, and a capacitor $C_{st}$ coupled to the first TFT TR1 and the second TFT TR2.

In the first TFT TR1, a gate electrode is coupled to the scan line S to receive a scan signal, a first electrode is coupled to the data line D, and a second electrode is coupled to a terminal of the capacitor $C_{st}$. In the present embodiment, the first electrode is set to be one of a source electrode and a drain electrode, and the second electrode is set to be the other of the source electrode and the drain electrode. For example, when the first electrode is set to be a drain electrode, the second electrode is set to be a source electrode. The first TFT TR1 coupled to the scan line S and the data line D is turned on when a scan signal is applied from the scan line S, and applies a data signal from the data line D to the capacitor $C_{st}$, thereby charging the capacitor $C_{st}$ with a voltage corresponding to the data signal.

In the second TFT TR2, a gate electrode is coupled to one terminal of the capacitor $C_{st}$, and a first electrode is coupled to the power supply source of the first power ELVDD. A second electrode of the second TFT TR2 is coupled to the other terminal of the capacitor $C_{st}$ and the anode of the organic light-emitting element OLED.

The second TFT TR2 controls the amount of current flowing from the power supply source of the first power ELVDD through the organic light-emitting element OLED to the power supply source of the second power ELVSS corresponding to energy stored in the capacitor $C_{st}$.

One terminal of the capacitor $C_{st}$ is coupled to the gate electrode of the second TFT TR2, and the other terminal of the capacitor $C_{st}$ is coupled to the anode of the organic light-emitting element. The capacitor $C_{st}$ is charged with a voltage corresponding to a data signal.

The sub-pixel 200 constructed as described above may display an image (e.g., an image having a predetermined brightness) by supplying current, which corresponds to energy charged in the capacitor $C_{st}$ to the organic light-emitting element.

Figure 3:
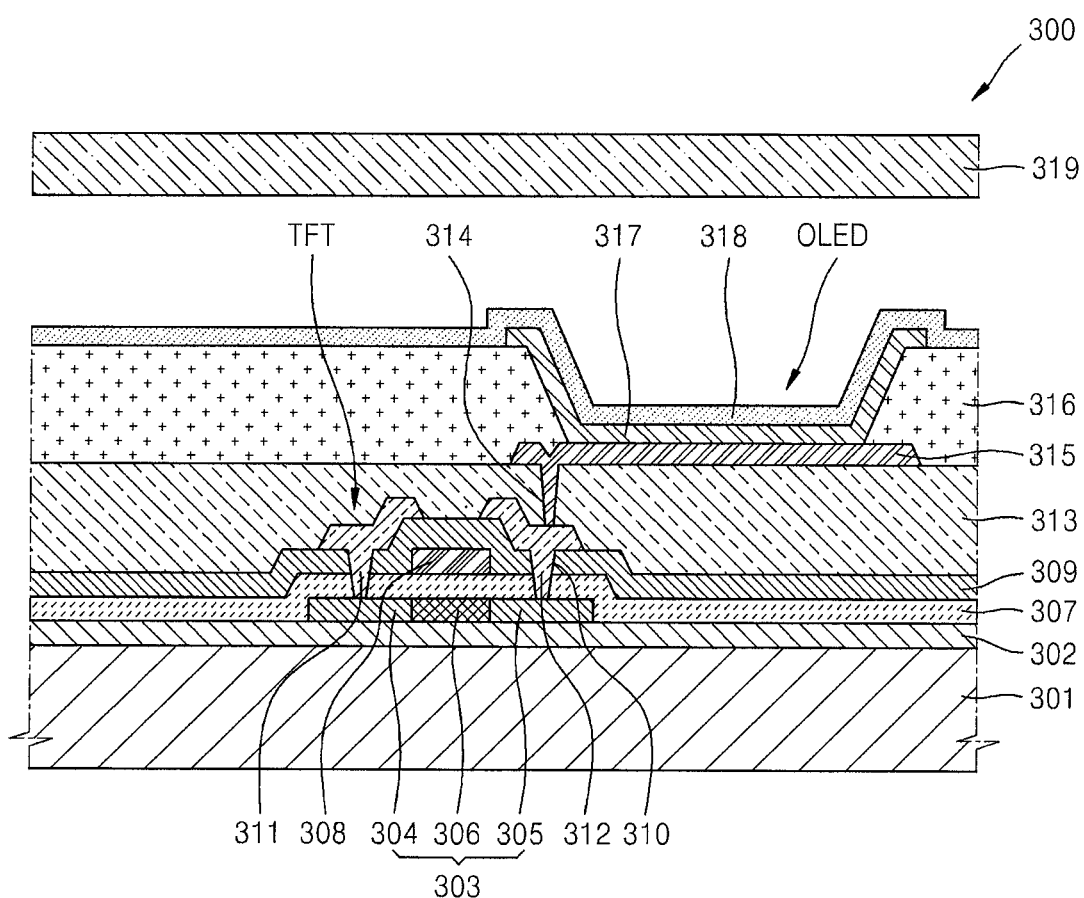
FIG. 3 is a cross-sectional view illustrating a sub-pixel of a display device, according to an embodiment of the present invention.

FIG. 3 is a cross-sectional view illustrating a sub-pixel of a display device 300, according to an embodiment of the present invention. The display device 300 of FIG. 3 is an organic light-emitting display device.

Referring to FIG. 3, the display device 300 includes a substrate 301, which may be a glass substrate, or a plastic substrate including polyethylene terephthalate (PET), polyethylene naphthalate (PEN), or polyimide (PI).

A barrier layer 302 is formed on the substrate 301, and may be formed of an inorganic material such as SiOx, SiNx, SiON, AlO, or AlON, or an organic material such as acryl or polyimide, or may be formed by alternately stacking an organic material and an inorganic material. The barrier layer 302 blocks oxygen and moisture, reduces or prevents moisture or impurities generated from the substrate 301 from diffusing, and adjusts a heat transfer rate during crystallization, thereby helping crystallization of a semiconductor.

A TFT is formed on the barrier layer 302. Although the TFT is a top-gate TFT in FIG. 3, the present embodiment is not limited thereto, and the TFT may be a bottom-gate TFT.

A semiconductor active layer 303 is formed on the barrier layer 302. When the semiconductor active layer 303 is formed of polysilicone, amorphous silicone may be formed and then crystallized to form polysilicone. Examples of methods of crystallizing amorphous silicone include rapid thermal annealing (RTA), solid phase crystallization (SPC), eximer laser annealing (ELA), metal induced crystallization (MIC), metal induced lateral crystallization (MILC), sequential lateral solidification (SLS), and low temperature polysilicone (LTPS).

A source region 304 and a drain region 305 are formed on the semiconductor active layer 303 by doping N-type impurity ions or P-type impurity ions. A region between the source region 304 and the drain region 305 is a channel region 306, which is not doped with impurities.

A gate insulating film 307 is deposited on the semiconductor active layer 303, and has a single-layer structure formed of $SiO_2$, or has a two-layer structure formed of $SiO_2$ and $SiN_x$.

A gate electrode 308 is formed on a portion of the gate insulating film 307, and is coupled to a gate line (not shown) for applying a TFT on/off signal. The gate electrode 308 may be formed of a single metal or a plurality of metals. For example, the gate electrode 308 may have a single-layer structure formed of molybdenum (Mo), molybdenum tungsten (MoW), chromium (Cr), aluminum (Al), magnesium (Mg), nickel (Ni), tungsten (W), or gold (Au), or may have a multi-layer structure formed of a combination of the above metals.

An interlayer insulating film 309 is formed on the gate electrode 308, and a source electrode 311 is electrically coupled to the source region 304, and a drain electrode 312 is electrically coupled to the drain region 305, through contact holes 310.

The interlayer insulating film 309 may be formed of an insulating material such as $SiO_2$ or $SiN_x$, or an insulating organic material. The contact holes 310 may be formed by selectively removing portions of the gate insulating film 307 and the interlayer insulating film 309.

A passivation film 313 is formed on the source electrode 311 and the drain electrode 312. The passivation film 313 enables planarization and protects the TFT thereunder. The passivation film 313 may be variously formed, and may be formed of, for example, an organic material such as benzocyclobutene (BCB) or acryl or an inorganic material such as SiNx, and may have a single-layer structure or a multi-layer structure.

The substrate 301 on which the TFT is formed corresponds to the substrate 110 on which the TFT is formed (FIG. 1).

A display element is formed on the TFT. Although an organic light-emitting element (e.g., OLED) is shown in FIG. 3, the present embodiment is not limited thereto, and any of various display elements may be used.

A first electrode 315 is electrically coupled through a contact hole 314 to the source electrode 311 or the drain electrode 312 to form the organic light-emitting element. The first electrode 315, which functions as an anode of the organic light-emitting element, may be formed of any of various conductive materials, and may be a transparent electrode or a reflective electrode according to the type of organic light-emitting element to be formed. For example, when the first electrode 315 is a transparent electrode, the first electrode 315 may include indium tin oxide (ITO), indium zinc oxide (IZO), zinc oxide (ZnO), or $In_2O_3$, and when the first electrode 3158 is a reflective electrode, a reflective film may be formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and then ITO, IZO, ZnO, or $In_2O_3$ may be formed on the reflective film.

A pixel-defining layer (PDL) 316 formed of an organic material is formed on the passivation film 313 to cover a portion of the first electrode 315 of the organic light-emitting element.

An organic layer 317 is formed on an exposed portion of the first electrode 315 when a portion of the PDL 316 is etched. A second electrode 318 of the organic light-emitting element is formed on the organic layer 317.

The first electrode 315 and the second electrode 318 are insulated from each other by the organic layer 317, and light is emitted from the organic layer 317 when voltages having different polarities are applied to the organic layer 317.

Although the organic layer 317 is patterned to correspond to each sub-pixel, that is, the first electrode 315 in FIG. 3 for convenience of explanation, the organic layer 317 may be integrally formed with the organic layer 317 of an adjacent sub-pixel. Alternatively, some layers of the organic layer 317 may be individually formed in each sub-pixel, and other layers of the organic layer 317 may be integrally formed with one or more organic layers 317 of one or more adjacent sub-pixels.

The organic layer 317 may be formed of, for example, a low-molecular organic material or a polymer organic material. When the organic layer 317 is formed of a low-molecular organic material, the organic layer 317 may have a single-layer structure including a hole injection layer (HIL), a hole transport layer (HTL), an emissive layer (EML), an electron transport layer (ETL), or an electron injection layer (EIL), or a multi-layer structure including a combination of the above layers. Also, examples of the low-molecular organic material used to form the organic layer 317 may include copper phthalocyanine (CuPc), N,N'-Di(naphthalene-1-yl)-N,N'-diphenyl-benzidine, (NPB), and tris-8-hydroxyquinoline aluminum (Alq3). The low-molecular organic materials may be formed by using vacuum deposition or the like.

When the organic layer 317 is formed of a polymer organic material, the organic layer 317 may have a structure including an HTL and an EML, and the HTL may be formed of poly(3,4-ethylenedioxythiophene) (PEDOT), and the EML may be formed of a poly-phenylenevinylene (PPV)-based or polyfluorene-based polymer organic material. The polymer organic materials may be formed by using screen printing or inkjet printing.

The organic layer 317 is not limited to the aforementioned embodiments and examples, and the organic layer 317 may be formed in various other ways.

The second electrode 318, which functions as a cathode, may be a transparent electrode or a reflective electrode, like the first electrode 315. When the second electrode 318 is a transparent electrode, the second electrode 318 may be formed by depositing on the organic layer 317 a metal having a low work function, such as lithium (Li), calcium (Ca), lithium fluoride/calcium (LiF/Ca), LiF/Al, Al, Mg, or a compound thereof, and forming an auxiliary electrode of a material for forming a transparent electrode, such as ITO, IZO, ZnO, or $In_2O_3$, on the metal.

When the second electrode 318 is a reflective electrode, the second electrode 318 is formed by depositing Li, Ca, LiF/Ca, LiF/Al, Al, Mg, or a compound thereof.

When the first electrode 315 is formed as a transparent electrode or a reflective electrode, the first electrode 315 may be formed to have a shape conforming to a shape of an opening of the sub-pixel. When the second electrode 318 is formed as a transparent electrode or a reflective electrode, the second electrode 318 may be formed by depositing a material over an entire surface of a display area, although the second electrode 318 does not have to be deposited on the entire surface, and may be formed in any of various patterns. In the present embodiment, positions of the first electrode 315 and the second electrode 318 may be reversed.

The organic light-emitting element including the first electrode 315, the second electrode 318, and the organic layer 317 corresponds to the organic light-emitting element including the first electrode 121, the second electrode 122, and the organic layer 123 of FIG. 1. As such, a display unit including the TFT and the organic light-emitting element is formed on the substrate 301.

A sealing substrate 319 is coupled to the organic light-emitting element. The sealing substrate 319 corresponds to the sealing substrate 130 including the first conductive film 131, the second conductive film 132, and the insulating film 133 of FIG. 1.

Figure 4:
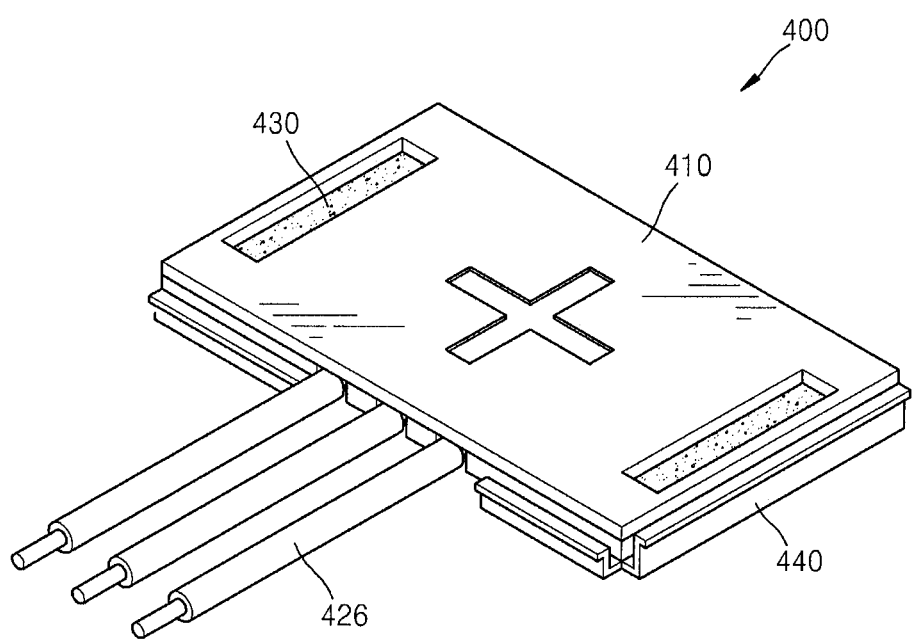
FIG. 4 is a perspective view illustrating a connector according to an embodiment of the present invention.
Figure 5:
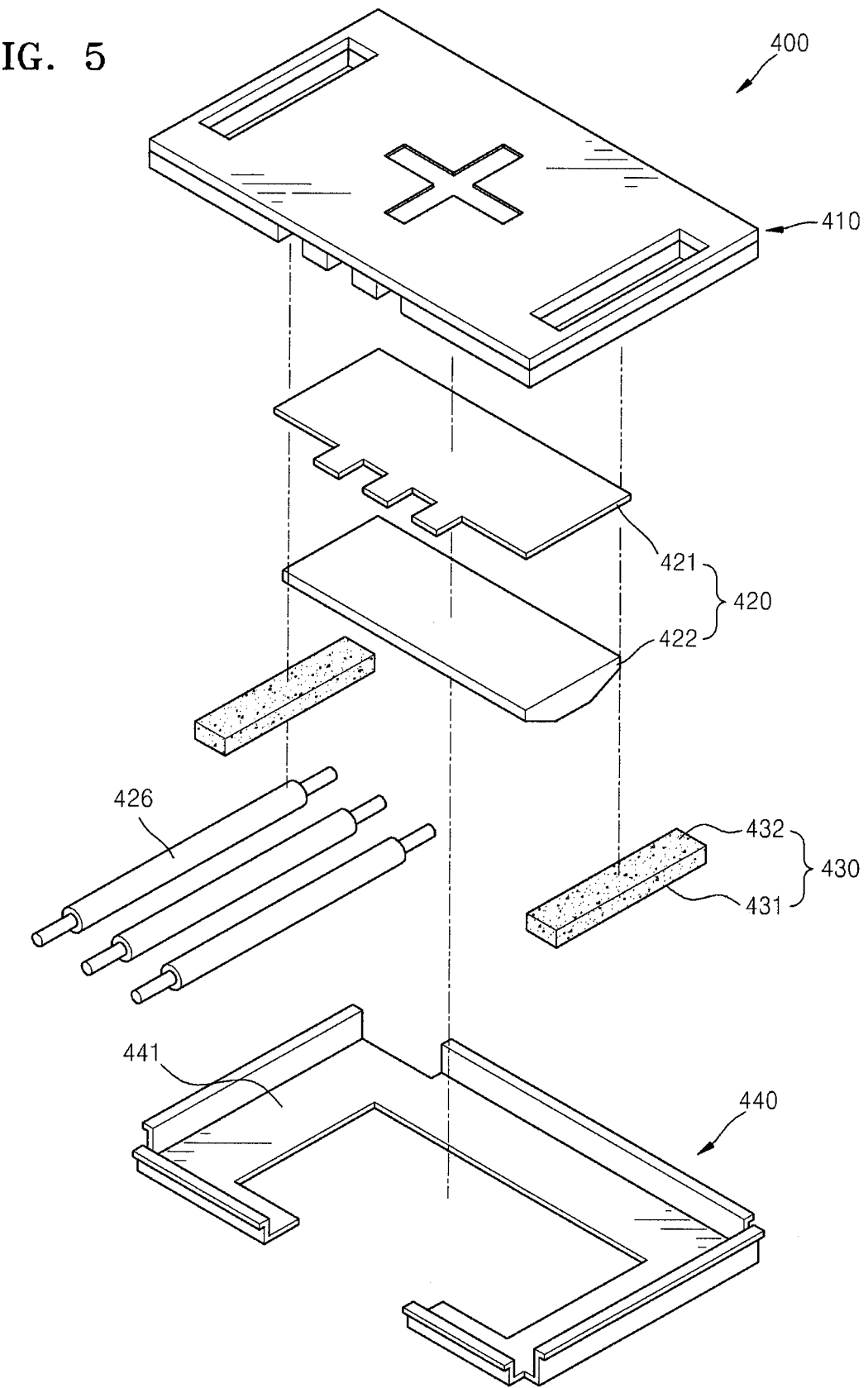
FIG. 5 is an exploded perspective view illustrating the connector of the embodiment shown in FIG. 4.
Figure 6:
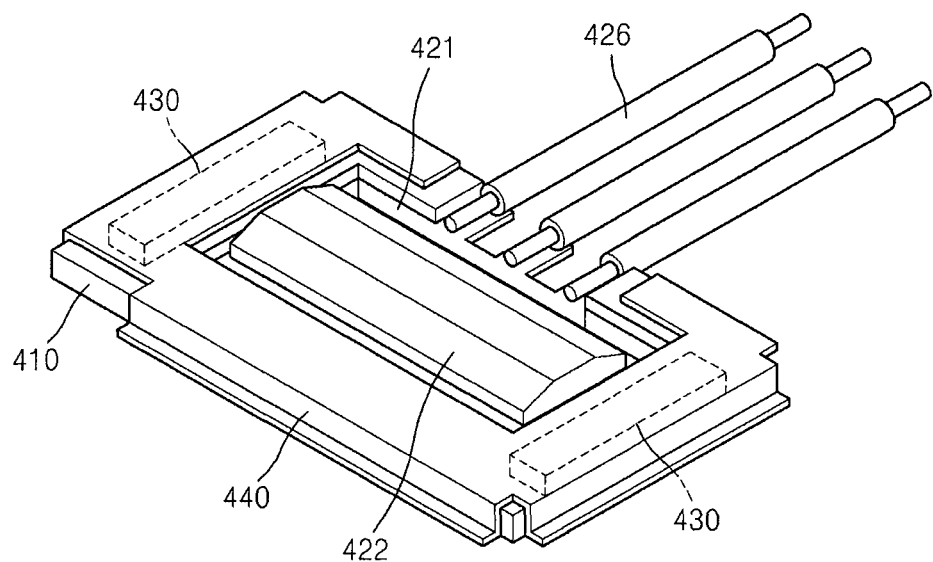
FIG. 6 is a perspective view illustrating a bottom surface of the connector of the embodiment shown in FIG. 4.
Figure 7:
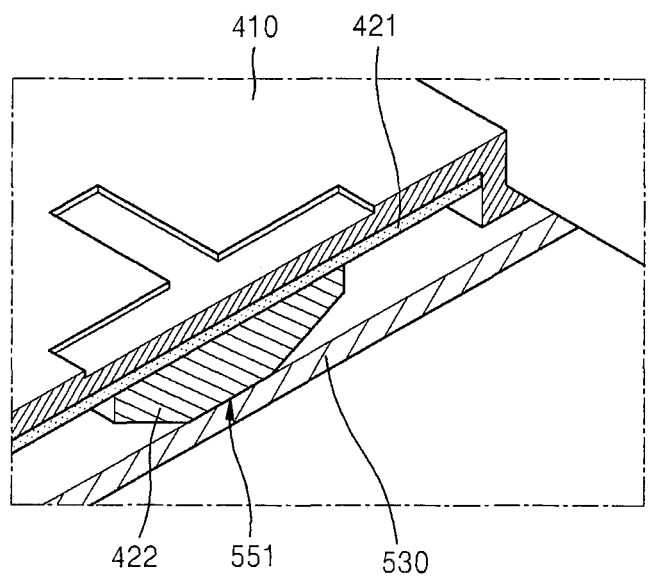
FIG. 7 is a partially cut perspective view illustrating the connector of the embodiment shown in FIG. 4 coupled to a power pad.

FIG. 4 is a perspective view illustrating a connector 400 according to an embodiment of the present invention. FIG. 5 is an exploded perspective view illustrating the connector 400 of the embodiment shown in FIG. 4. FIG. 6 is a perspective view illustrating a bottom surface of the connector 400 of the embodiment shown in FIG. 4. FIG. 7 is a partially cut perspective view illustrating the connector 400 of the embodiment shown in FIG. 4 coupled to a power pad 551.

The connector 400 of FIG. 4 corresponds to the first connector 171 and the second connector 172, which are respectively coupled to the first power pad 141 and the second power pad 142 formed on the sealing substrate 130 of the embodiment shown in FIG. 1. Also, two connectors 400 are provided and are respectively coupled to two power pads 551 (see FIG. 7).

Referring to FIGS. 4 through 7, the connector 400 includes a housing unit 410, a power connection unit 420 in the housing unit 410 and electrically coupled to the power pad 551 of a sealing substrate 530, and a power contact unit 430 that enables electrical contact between the power pad 551 and the power connection unit 420.

At least one circuit board 421 is included in the power connection unit 420. A circuit pattern for supplying first power ELVDD or second power ELVSS is formed on the circuit board 421.

Figure 8:
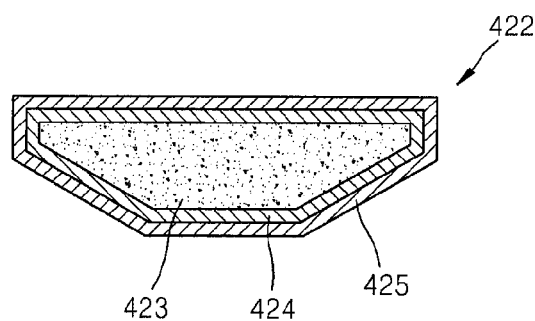
FIG. 8 is a cross-sectional view illustrating a conductive gasket of the embodiment shown in FIG. 4.

A conductive gasket 422 is coupled to the circuit board 421. One side of the conductive gasket 422 is electrically coupled to the circuit board 421, and the other side of the conductive gasket 422 is electrically coupled to the power pad 551. To this end, as shown in FIG. 8, the conductive gasket 422 includes an elastic portion 423 having elasticity, and having a gasket shape formed of an elastic material such as polyurethane, rubber or siliconee. The elastic portion 423 may be subjected to a resistance heat treatment.

A conductive portion 425 is formed on an outer surface of the elastic portion 423, and surrounds the elastic portion 423 with a heat resistant adhesive 424 therebetween. The conductive portion 425 may be formed of a metal foil. For example, the conductive portion 425 may be formed by forming a copper foil on polyimide. A metal plating layer such as, for example, a tin plating layer may be further formed on an outer surface of the copper foil.

When the conductive gasket 422 maintains a compression ratio of 15% or more, the conductive gasket 422 may ensure reliable area contact with the power pad 551. Accordingly, an outer surface of the conductive gasket 422 facing the power pad 551 is curved to ensure more uniform (or substantially uniform) area contact with the power pad 551.

A plurality of wires 426 of an external power supply unit for supplying power is coupled to one end of the circuit board 421.

The power connection unit 420 including the circuit board 421 and the conductive gasket 422 is mounted in the housing unit 410.

An additional device for maintaining contact when the connector 400 is coupled to the power pad 551 may be used. For example, when a thermal joining method such as welding or soldering is used, damage to the sealing substrate 530 may result. Accordingly, to avoid, reduce, or prevent such damage, the power contact unit 430 may maintain contact between the power pad 551 and the connector 400 by using magnetism.

The power contact unit 430 may include a magnetic material, for example, a neodymium magnet. The power contact unit 430 is located around the conductive gasket 422, and has a first surface 431 facing the sealing substrate 530, and a second surface 432 opposite to the first surface 431. The first surface 431 is attached to an outer surface of the sealing substrate 530, and the second surface 432 is inserted into the housing unit 410.

In the present embodiment, a conductive plate 440 may be further provided between the power contact unit 430 and the sealing substrate 530. For example, when the outer surface of the sealing substrate 530 is formed of copper, the sealing substrate 530 is not attached to the power contact unit 430 formed of a magnetic material. Accordingly, the power contact unit 430 might not maintain contact between the connector 400 and the power pad 551.

To avoid or prevent this problem, or to reduce the extent thereof, the conductive plate 440 is provided on the outer surface of the sealing substrate 530, and may be fixed to the outer surface of the sealing substrate 530 using double-sided tape. The first surface 431 of the power contact unit 430 is attached to a mount surface 441 of the conductive plate 440.

The conductive plate 440 is coupled to the housing unit 410 in which the power connection unit 420 including the circuit board 421 and the conductive gasket 422, and the power connection unit 430 are received.

A state where the connector 400 constructed as described above is coupled to the power pad 551 will now be explained.

The circuit board 421 on which a circuit pattern layer is formed is mounted in the housing unit 410. The plurality of wires 426, which are paths through which power is supplied from the external power supply unit, are coupled to the circuit board 421.

One side of the conductive gasket 422 is electrically coupled to a bottom surface of the circuit board 421. The other side of the conductive gasket 422 contacts the power pad 551 formed on the sealing substrate 530. Accordingly, the first power ELVDD or the second power ELVSS may be supplied to a display device.

Because the conductive gasket 422 has a compression ratio of 15% or more, and because the outer surface of the conductive gasket 422 facing the power pad 551 is curved, the conductive gasket 422 may enable more uniform (or substantially uniform) area contact with the power pad 551.

To maintain contact between the conductive gasket 422 and the power pad 551, the power contact unit 430 is attached to the conductive plate 440. The conductive plate 440 is fixed to the outer surface of the sealing substrate 530 using double-sided tape, and the power contact unit 430 is attached to the mount surface 441 of the conductive plate 440.

As such, since the power contact unit 430 is attached to the conductive plate 440, the first power ELVDD or the second power ELVSS may be supplied through the connector 400 to the power pad 551.

A first power path and a second power path through which the first power ELVDD and the second power ELVSS are respectively supplied to a first electrode having a positive polarity and a second electrode having a negative polarity in the display device have already been explained, and thus an explanation thereof will not be given.

Figure 9:
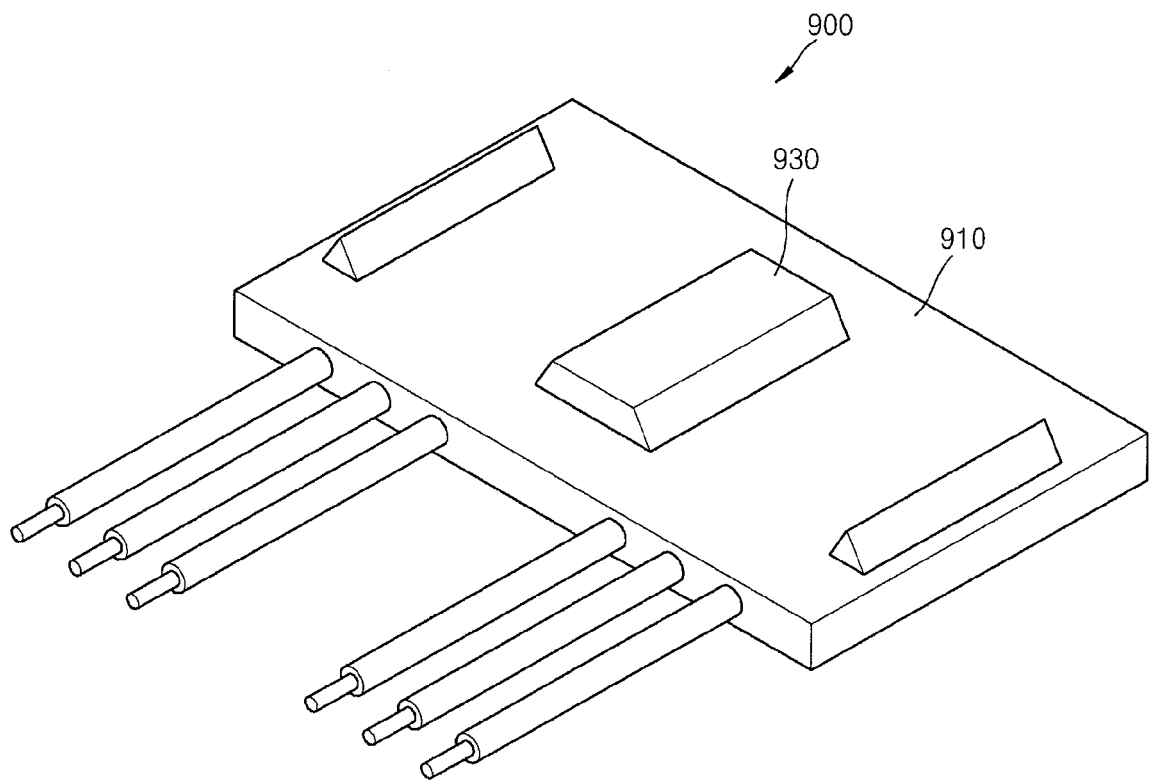
FIG. 9 is a perspective view illustrating a connector according to another embodiment of the present invention.

FIG. 9 is a perspective view illustrating a connector 900 according to another embodiment of the present invention.

In FIG. 4, two connectors 400 for supplying the first power ELVDD and the second power ELVSS to a first pad and a second pad of a display device are shown.

In FIG. 9, one connector 900, instead of the two connectors 400, is used to supply the first power ELVDD and the second power ELVSS. To this end, a plurality of the power connection units 420 (see FIG. 4) including a plurality of the conductive gaskets 422 (see FIG. 4) are provided in a housing unit 910 of the connector 900.

Also, at least one power contact unit 930 is formed in the housing unit 910 to maintain contact when the conductive gaskets 422 of the power connection units 420 are concurrently coupled (e.g., simultaneously coupled) to a plurality of pads formed on a sealing substrate. The power contact unit 930 is formed of a magnetic material and is provided around the conductive gaskets 422.

As such, because two connectors for supplying the first power ELVDD and the second power ELVSS are combined into one connector 900, and because the number of power contact units, the number of times connectors are coupled, or the number of connectors are reduced, costs may be reduced.

As described above, because the display device according to embodiments of the present invention is structured such that a connector including a conductive gasket contacts a power pad formed on a sealing substrate to supply power, welding or soldering is not required. Accordingly, damage to the display device may be avoided. Also, when power is supplied, since a power contact unit having magnetism is provided between the sealing substrate on which the power pad is formed and the connector, contact may be maintained and power may be stably supplied.

While embodiments of the present invention have been particularly shown and described with reference to exemplary embodiments thereof, it will be understood by those of ordinary skill in the art that various changes in form and details may be made therein without departing from the spirit and scope of the present invention as defined by the following claims, and their equivalents.

What is claimed is:

1. A display device comprising:
    a substrate;
    a display unit on the substrate;
    a sealing substrate coupled to the display unit;
    a plurality of power pads on the sealing substrate and electrically coupled to the display unit; and
    a connector comprising a housing unit, a power connection unit electrically coupled to the plurality of power pads, and a power contact unit for maintaining contact between the plurality of power pads and the power connection unit.

2. The display device of claim 1, wherein the power connection unit comprises:
    a circuit board for applying an electrical signal to the plurality of power pads; and
    a conductive gasket comprising a first side electrically coupled to the circuit board, and a second side electrically coupled to the plurality of power pads.

3. The display device of claim 2, wherein a plurality of wires configured to be coupled to an external power supply unit for supplying external power are coupled to the circuit board.

4. The display device of claim 2, wherein the conductive gasket comprises:
    an elastic portion; and
    a conductive portion coupled to the elastic portion, and coupled to the circuit board and the plurality of power pads.

5. The display device of claim 4, wherein the conductive portion surrounds the elastic portion with an adhesive therebetween.

6. The display device of claim 4, wherein an outer surface of the conductive gasket is curved to enable substantially uniform area contact with the plurality of power pads.

7. The display device of claim 4, wherein the elastic portion comprises at least one of polyurethane, rubber, or siliconee.

8. The display device of claim 4, wherein the conductive portion comprises a metal foil.

9. The display device of claim 1, wherein the power contact unit comprises a magnetic material for attracting the sealing substrate to the connector using magnetic force.

10. The display device of claim 9, wherein the magnetic material comprises a neodymium magnet.

11. The display device of claim 9, wherein the power contact unit comprises a first surface attached to an outer surface of the sealing substrate, and a second surface opposite to the first surface and located in the housing unit.

12. The display device of claim 9, further comprising a conductive plate between the sealing substrate and the connector.

13. The display device of claim 12, wherein the power contact unit comprises a first surface attached to a mount surface of the conductive plate, and a second surface opposite to the first surface and located in the housing unit,
    wherein the conductive plate is attached to an outer surface of the sealing substrate by an adhesive.

14. The display device of claim 1, wherein the plurality of power pads comprise a first power pad, and a second power pad, and wherein the connector comprises at least one power contact unit, and first and second power connection units in the housing unit and electrically coupled to the first power pad and the second power pad, respectively.

15. The display device of claim 1, wherein the plurality of power pads comprises a first power pad and a second power pad that each contact a conductive gasket,
wherein the sealing substrate comprises:
an insulating film comprising a first surface facing away from the display unit, and a second surface facing the display unit;
a first conductive film on the first surface; and
a second conductive film on the second surface,
wherein the first power pad is for supplying first power and is located on a surface of the first conductive film, and
wherein the second power pad is for supplying second power and is located on a surface of the second conductive film.

16. The display device of claim 15, wherein the display unit comprises a first electrode having a positive polarity and a second electrode having a negative polarity,
wherein a first connecting unit for applying an electrical signal is between the first electrode and the first conductive film to form a first power path, and
a second connecting unit for applying an electrical signal is between the second electrode and the second conductive film to form a second power path.

17. The display device of claim 16, wherein the first connecting unit comprises:
a first connection unit on a wiring line coupled to the first electrode;
a contact unit electrically coupled to the first connection unit and corresponding to a gap in the second conductive film; and
a second connection unit at an edge of the insulating film and electrically coupled to the contact unit and the first conductive film.

18. The display device of claim 17, wherein each of the first connection unit and the second connection unit comprises a conductive tape or a conductive ball.

19. The display device of claim 16, wherein the second pad is located on an outer surface of the second conductive film that is exposed to the outside through a first hole in the first conductive film and a second hole in the insulating film.

20. The display device of claim 19, wherein the second connecting unit is located on a wiring line coupled to the second electrode, and is electrically coupled to the second conductive film.

21. The display device of claim 20, wherein the second connecting unit comprises a conductive tape or a conductive ball.

22. The display device of claim 1, wherein the display unit comprises:
a thin film transistor (TFT) on the substrate;
an insulating layer for insulating an element of the TFT; and
an organic light-emitting element electrically coupled to the TFT, and comprising a first electrode, an organic layer on the first electrode, and a second electrode on the organic layer.

* * * * *